United States Patent [19]

Morita

[11] Patent Number: 5,540,811
[45] Date of Patent: Jul. 30, 1996

[54] METHOD OF MANUFACTURING SEMICONDUCTOR DEVICE

[75] Inventor: Shigeru Morita, Fujisawa, Japan

[73] Assignee: Kabushiki Kaisha Toshiba, Tokyo, Japan

[21] Appl. No.: 172,483

[22] Filed: Dec. 22, 1993

[30] Foreign Application Priority Data

Dec. 22, 1992  [JP]  Japan .................. 4-342618

[51] Int. Cl.⁶ ............................................. H01L 21/00
[52] U.S. Cl. ........................ 156/636.1; 156/645.1; 156/648.1; 156/657.1; 156/661.11; 156/662.1; 437/225
[58] Field of Search ............. 156/633.1, 636.1, 156/648.1, 645.1, 657.1, 659.11, 661.11, 662.1; 437/67, 225, 228

[56] References Cited

U.S. PATENT DOCUMENTS 4,662,064  5/1987  Hsu et al. ..................... 156/653 X
5,077,234  12/1991  Scoopo et al. .................. 437/67
5,290,396  3/1994  Schoenborn et al. ............. 156/636

FOREIGN PATENT DOCUMENTS 0340524  11/1989  European Pat. Off. .
0461498  12/1991  European Pat. Off. .

*Primary Examiner*—William Powell
*Attorney, Agent, or Firm*—Loeb & Loeb LLP

[57] ABSTRACT

To planarize the surface of a semiconductor substrate having convex and concave portions as with the case of a trench structure or a multilayer interconnection structure, a burying film is formed all over the surface of the semiconductor substrate to bury the convex portions; a stopper layer is selectively formed on the burying film at the concave portions; and the burying film is removed flatwise by mechanical polishing until the surface of the convex portion is exposed. The method can simply realize a highly precise planarized structure. Further, it is also preferable to form another stopper layer on the surfaces of the convex portions.

30 Claims, 12 Drawing Sheets

FIG. IE ered to be planarized can be reduced as compared with the conventional planarization process by mechanical polishing; (2) since the stopper layer is formed on the surfaces of the convex portions, it is possible to control the end of the mechanical polishing accurately by the presence of the stopper layer; and (3) the planarization can be achieved by only one process of mechanical polishing.

METHOD OF MANUFACTURING SEMICONDUCTOR DEVICE

BACKGROUND OF THE INVENTION

1. Field of the Invention

The present invention relates to a method of manufacturing a semiconductor device, and more specifically to a method of planarizing (flattening) a rough surface of a semiconductor substrate by filling depressed (concave or trench) portions on the semiconductor surface with a burying material.

2. Description of the Prior Art

In manufacturing highly integrated semiconductor devices such as VLSI devices, it is necessary to reduce the level difference produced on the surface of a semiconductor substrate. In the case of multi-layer interconnection techniques, for instance, when an interlayer insulating film is deposited on a first metallic interconnection layer and further a second metallic interconnection layer is formed on the interlayer insulating film, since a level difference is inevitably produced in the second metallic interconnection layer, there exists a problem in that the reliability is degraded due to disconnection or an increase of resistance. Accordingly, it is necessary to planarize the interlayer insulating film deposited between the two metallic interconnection layers.

Further, when trenches are formed on the surface of a semiconductor substrate as element isolation regions or capacitances, as with the case of DRAM devices, it is also necessary to bury trenches (depressed portions) in the same way as above.

A conventional method of planarizing the surface of a semiconductor substrate by burying concave portions on the semiconductor substrate surface will be described hereinbelow with reference to the attached drawings.

FIG. 10 is a cross-sectional view for assistance in explaining a conventional planarizing method. In FIG. 10, there are convex portions 10B and concave portions 104 on the surface of a semiconductor substrate 101. Therefore, a burying material is deposited all over the surface of the semiconductor substrate 101 to form a burying film 102 and to bury the concave portions 104. Thereafter, the substrate 101 is polished flatwise to the surface of the convex portions 103 from above as shown by dashed lines in FIG. 10, so that only the concave portions 104 can be filled with a burying film 102 for planarization of the surface of the semiconductor substrate 101.

In this conventional method, however, when the area of the concave portion is large, since the surface is depressed, the degree of surface planarization has been not so far satisfactory as a whole.

To overcome the above-mentioned problem, another method has been proposed. This conventional method will be described hereinbelow with reference to FIG. 11A to 11G, in which the similar portions are designated by the same reference numerals shown in FIG. 10.

In this method, as shown in FIG. 11A, a stopper layer 201 having a low mechanical polishing speed is formed on the surfaces of the convex portions 103 on the surface of the semiconductor surface 101. Thereafter, as shown in FIG. 11B, a burying film 102 is formed by depositing a burying material all over the surface of the semiconductor substrate 101. Under these conditions, the burying film 102 is depressed as a concave portion 105 at a relatively broad convex portion 104. Further, as shown in FIG. 11C, a planarizing block (resist) 202 is selectively formed at the concave portion 105 of the burying film 102. Further, as shown in FIG. 11D, a planarizing material of high fluidity is applied on the convex and concave portions 103 and 104 and dried to form a planarizing film 203. Thereafter, as shown in FIG. 11E, the planarizing film 203, the planarizing block 202 and a burying film 102 are all etched back by reactive ion etching (RIE), which is an anisotropic etching to the vicinity of the stopper layer 201. Finally, as shown in FIG. 11F, a rough portion 204 produced due to a difference in the etching speed of the RIE between the respective materials is removed by mechanical polishing. In this process, the end of the mechanical polishing can be controlled by the presence of the stopper layer 201.

In the above-mentioned mechanical polishing method (referred to as polishing method or lapping method), a surface grinder is rotated under the condition that the grinder surface is brought into tight contact with the surface of the semiconductor substrate. In this polishing, an appropriate abrasive material for cutting off the material of the substrate surface is intervened between the surface grinder and the substrate surface to cut off the material of the substrate surface. The abrasive material is a liquid including uniform spherical particles of silicon oxide with particle diameters of about several tenths of a micron to several microns and a liquid including these particles separately without gelatinization.

Further, as shown in FIG. 11G, when the stopper layer 201 is removed, it is possible to obtain a semiconductor structure in which the concave portions 104 of the semiconductor substrate are filled with a burying film 102 being flush with the surface layer of the convex portions 103 of the semiconductor substrate 101.

In the conventional method, however, since the planarizing block 202 and the two planarizing layers 102 and 203 are required to be formed, there exists a problem in that the number of manufacturing processes increases. In addition, the RIE etching rates of the planarizing block, the planarizing layers and the burying material must be all equal to each other in order to increase the degree of planarization. In practice, however, it is very difficult to select such materials and such manufacturing conditions that the RIE etching rates for these three layers become equal to one another, with the result that the finally remaining convex and concave portions must be further polished mechanically. In other words, two processes of the RIE and the mechanical polishing are inevitably required for the conventional planarization process, thus raising a problem in that the number of manufacturing processes is increased.

Further, it is also possible to planarize the substrate surface by effecting the mechanical polishing together after the planarizing block and the planarizing layer have both been formed. In this method, however, since the mechanical polishing speed must be increased to increase the productivity thereof, the roughness of the polished substrate surface increases with increasing polishing speed and in addition it is rather difficult to control the mechanical polishing by the presence of the stopper layer. Further, in this method, although the mechanical polishing speed must be kept uniform for the three layers from the standpoint of planarization, in the same way as with the case of the RIE, this is more difficult than the case of the RIE. Further, in order to shorten the polishing time, in the case where the substrate is polished without forming the planarizing block 202 or the planarizing layer 208, although the polishing speed at the concave portions is slow as compared with that at the convex portions, since the polishing speeds at both the portions become close to each other at the middle portion in a broad concave portion, the burying material is polished away at only the concave portions, with the result that it is difficult to planarize all over the surface of the semiconductor substrate.

SUMMARY OF THE INVENTION

With these problems in mind, therefore, it is the object of the present invention to provide method of manufacturing a semiconductor device of highly precise planarization structure.

According to the present invention there is provided a method of manufacturing a semiconductor device, comprising the steps of:

forming a first stopper layer on a surface of a convex portion of a semiconductor substrate having convex and concave portions on a surface thereof;

forming a burying film all over the surface of the semiconductor substrate to bury the concave portion;

forming a second stopper layer selectively on a surface of the burying film at the concave portion; and removing the burying film flatwise by polishing until a surface of the first stopper layer is exposed.

According to another aspect of the invention, there is provided a method of manufacturing a semiconductor device, comprising the steps of:

forming a burying film on a surface of a semiconductor substrate having convex and concave portions on a surface thereof to bury the concave portion;

forming a first stopper layer selectively on a surface of the burying film at the concave portion; and removing the burying film flatwise by polishing until a surface of the convex portion is exposed.

According to third aspect of the present invention, there is provided a method of manufacturing a semiconductor device, comprising the steps of:

forming a first polysilicon layer as a first stopper layer on a surface of a convex portion of a semiconductor substrate having convex and concave portions on a surface thereof;

forming a burying film all over the surface of the semiconductor substrate to bury the concave portion;

forming a second polysilicon layer as a second stopper layer selectively on a surface of the burying film at the concave portion in accordance with anisotropic etching; and removing the burying film flatwise by polishing until a surface of the first stopper layer is exposed.

In the method according to the present invention, since a stopper layer is formed at the concave portions to prevent an excessive polishing, it is possible to obtain a burying film of a high planarization degree as a whole.

Further, since the semiconductor substrate is polished by use of a first stopper layer formed at the convex portions on the substrate and a second stopper layer formed on the burying film at the concave portions, it is possible to fill a burying material only at the concave portions on the substrate and thereby to planarize the substrate surface precisely. In addition, on the basis of combinations of the materials of the first and second stopper layers (i.e., the selection of the polishing speed of the burying material and the optimization of the film thicknesses), it is possible to omit the processes of forming the block resist and the planarization resist and further the RIE etching-back process before polishing (which are all so far required for the conventional planarization process), thus simplifying the manufacturing process for planarizing the semiconductor substrate, as compared with the conventional process.

BRIEF DESCRIPTION OF THE DRAWINGS

FIGS. 1A to 1E are cross-sectional views for assistance explaining the basic process of the method of manufacturing the semiconductor device according to the present invention;

DETAILED DESCRIPTION OF THE PREFERRED EMBODIMENTS

Figure 10:
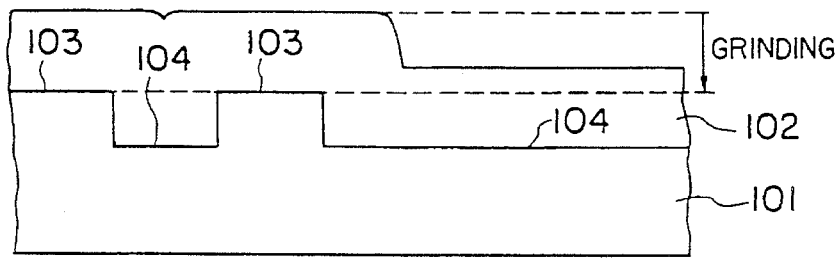
FIGS. 10 is a cross-sectional view showing a conventional semiconductor device.
Figure 11A:
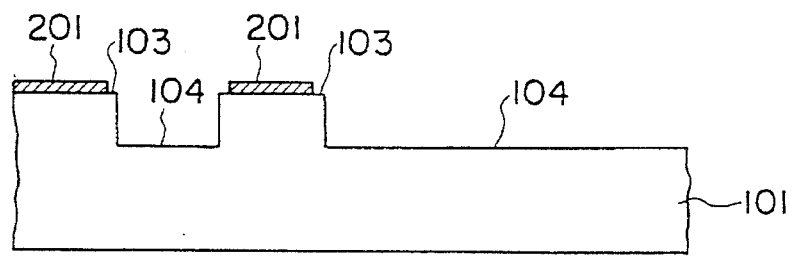
FIGS. 11A to 11G are cross-sectional views for assistance in explaining the conventional process of manufacturing the semiconductor device.
Figure 11B:
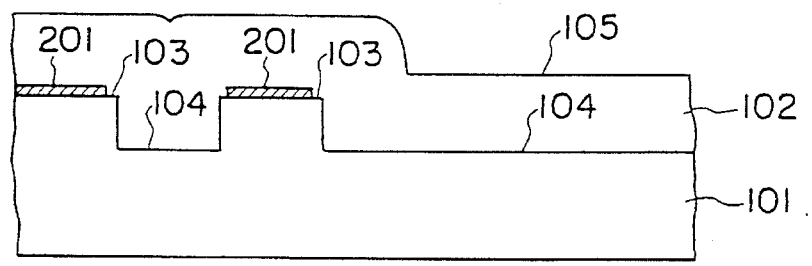
Figure 11C:
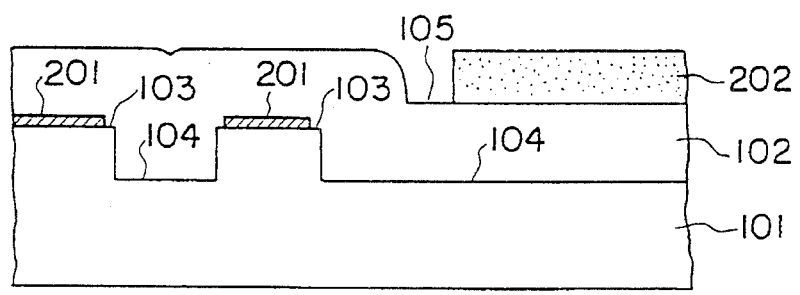
Figure 11D:
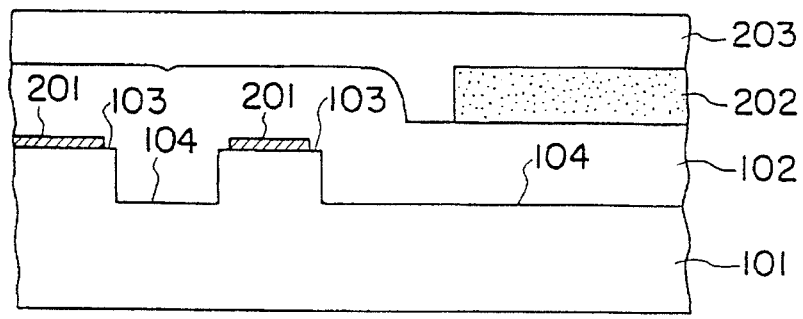
Figure 11E:
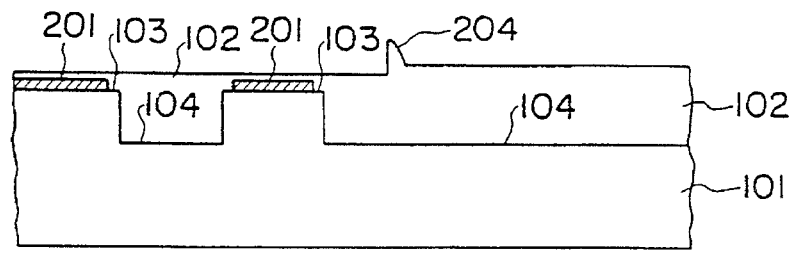
Figure 11F:
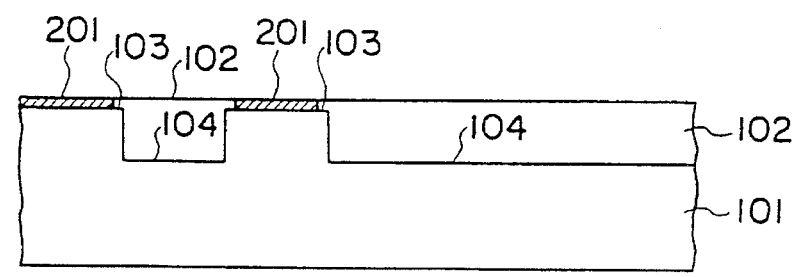
Figure 11G:
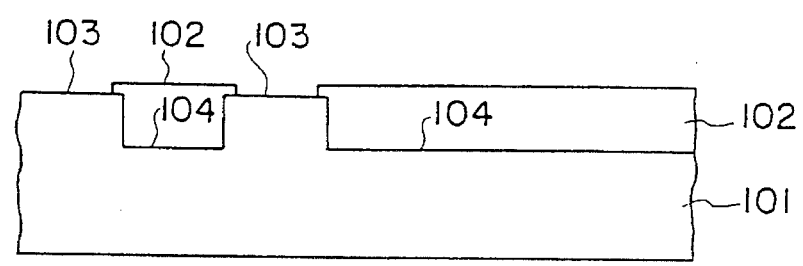

The basic manufacturing process according to the present invention will be described hereinbelow with reference to FIGS. 1A to 1E, in which the same reference numerals have been retained for the similar elements or portions which have the same functions as with the case of the conventional manufacturing process shown in FIGS. 10 and 11.

Figure 1A:
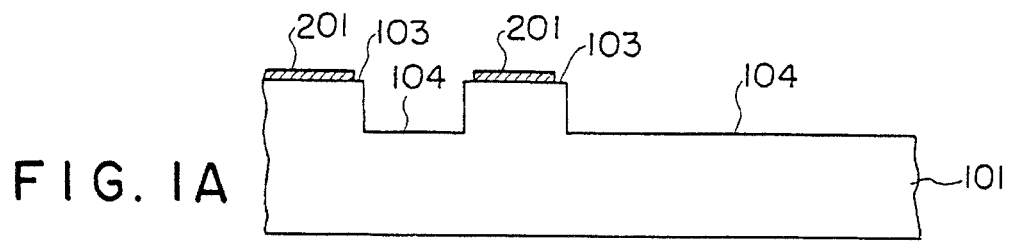

First, as shown in FIG. 1A, a first stopper layer 201 is formed on the upper surfaces of convex portions 103 of a semiconductor substrate 101. This stopper layer 201 is formed of a material whose polishing speed is lower than that of a burying material, so as to serve as a polishing stopper in the later polishing process in which the burying material laminated on the surfaces of the convex portions 103 on the surface of the substrate 101 is polished.

Figure 1B:
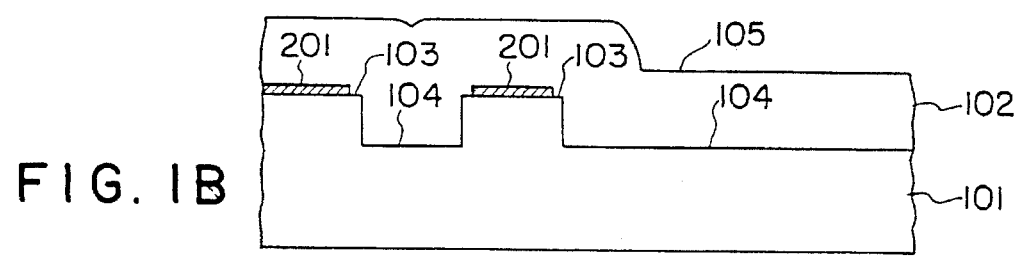

Further, as shown in FIG. 1B, a burying film 102 for burying the concave portions 104 is formed uniformly all over the surface of the convex and concave portions formed on the surface of the semiconductor substrate 101.

Figure 1C:
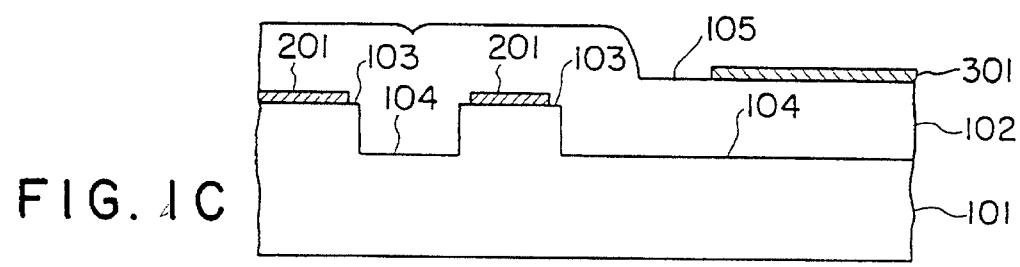

Further, as shown in FIG. 1C, a second stopper layer 301 is formed on the surface of a concave portion 105 of the burying film 102 formed at the relatively broad concave portion 104 of the semiconductor substrate 101. This second stopper layer 301 also serves as a stopper layer in the later polishing process in which the burying film 102 formed on the surfaces of the convex portions 103 on the surface of the semiconductor substrate 101 is polished. The material of this stopper layer 301 is also selected so that the polishing speed thereof is lower than that of the material of the burying film 102.

Figure 1D:
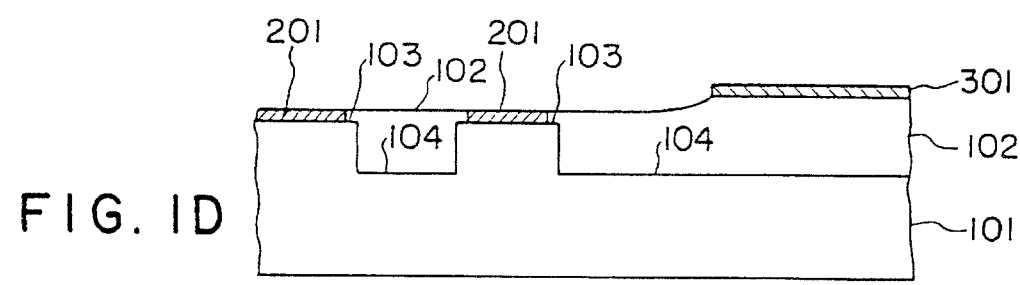

Thereafter, as shown in FIG. 1D, the burying film 102 is polished flatwise by mechanical polishing until the surface of the first stopper layer 201 is exposed.

Successively, as shown in FIG. 1E, the first and second stopper layers 201 and 301 are removed to expose the surface of the convex portions 103 of the semiconductor substrate 101, with the result that it is possible to planarize the surface of the semiconductor substrate 101.

In the above-mentioned manufacturing process, for instance, when the burying film 102 is used as an insulating film, the concave portions 104 buried by an insulating film (formed in accordance with the above-mentioned process) are used as element separating regions, and the surfaces of the convex portions 103 are used as element regions, it is possible to form an active element on the element regions 103 isolated by the element-isolating regions (buried film) 102 in accordance with well-known manufacturing methods.

In the above-mentioned method, it is necessary that a difference in polishing speeds exists between the material of the second stopper layer 301 and the material of the burying film 102 from the standpoint of mechanical polishing; that is, the polishing speed of the material of the second stopper layer 301 must be lower than that of the material of the burying film 102. In addition, the film thickness of the second stopper layer 301 must be smaller than the level difference between the concave and convex portions formed on the surface of the substrate 101; the film thickness of the burying film 102 must be close to the level difference between the concave and convex portions formed on the surface of the substrate 101 from the standpoint of planarization; and there exists no large level difference between the surfaces of the convex portions 103 and the surface of the burying film 102 buried in the concave portions 104 which is at least twice as thick as the film thickness of the burying film 102. In addition, it is ideal that the mechanical polishing speed of the material of the first stopper layer 201 is lower than that of the material of the burying film 102, in the same way as with the case of the material of the second stopper layer 301. However, when the stopping effect by the material of the second stopper layer 301 is large, the above-mentioned ideal condition is not necessarily required.

A more practical example or a first embodiment of the above-mentioned process will be described with reference to FIGS. 2A to 2J, in which the present invention is applied to an element isolation, in particular.

Figure 2A:
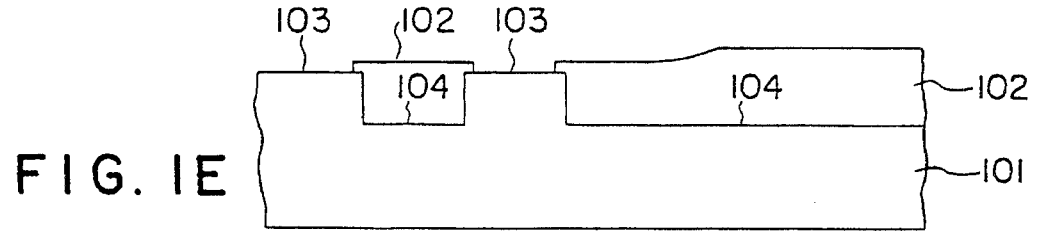
FIGS. 2A to 2J are cross-sectional views for assistance explaining a first embodiment of the method of manufacturing the semiconductor device according to the present invention.
Figure 2A:
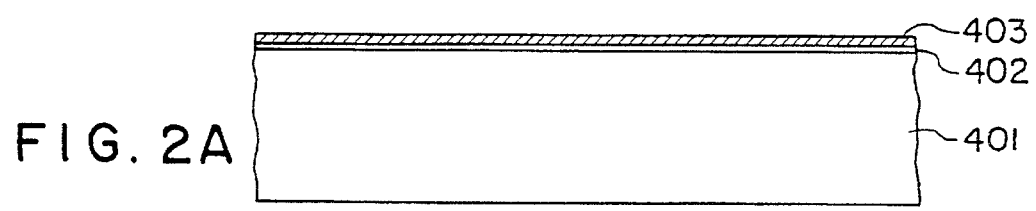

First, as shown in FIG. 2A, a P-type (100) silicon semiconductor substrate 401 with a resistivity of 1 to 2 Ωcm is oxidized within an oxidizing atmosphere at about 1000° C. to form a silicon oxide film 402 with a thickness of about 15 nm on the surface thereof as a protective film. Further, a first silicon nitride film 403 with a thickness of about 100 nm is deposited as a first stopper layer on the silicon oxide film 402 in accordance with a CVD (chemical vapor deposition) technique.

Figure 2B:
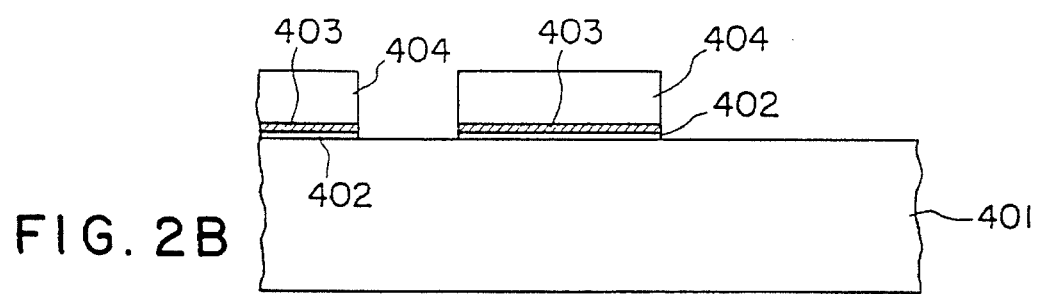

Successively, as shown in FIG. 2B, a photoresist is applied on the silicon nitride film 403 to obtain a resist pattern 404 by photo-lithography. With the use of the obtained mask, the first silicon nitride film 403 and the silicon oxide film 402 both formed on the regions at which element isolation regions are to be formed are selectively removed by an anisotropic etching technique (e.g., the RIE method) to expose the surface of the substrate 401.

Figure 2C:
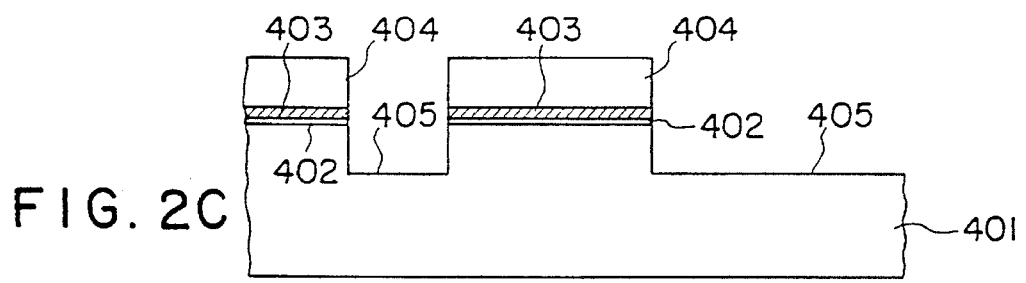

Further, as shown in FIG. 2C, the semiconductor substrate 401 is further etched by the RIE method under other conditions with the use of the resist pattern 404 and the silicon nitride film 403 as masks, to form trenches 405 with a depth of about 0.5 micron on the surface of the substrate 401.

Figure 2D:
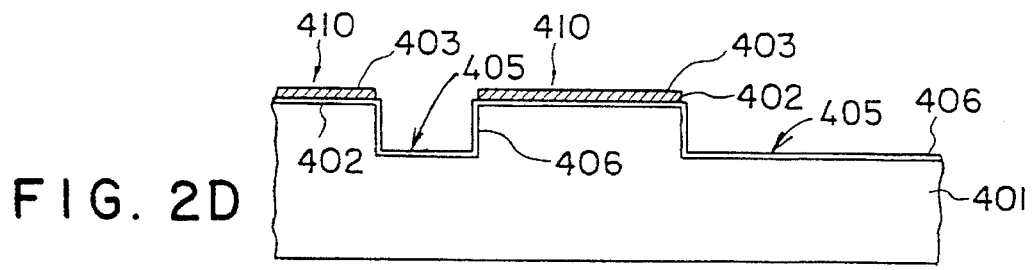

Further, as shown in FIG. 2D, the unnecessary resist pattern 404 is removed and then the exposed surfaces within the trenches 405 of the substrate 401 are cleaned. Thereafter, the surface of the substrate 401 is oxidized at about 900° C. within an oxidizing atmosphere to form a silicon oxide film 406 with a thickness of about 10 nm as an insulating film. Under these conditions, convex portions 410 and concave portions 405 are formed on the surface of the substrate 401.

Figure 2E:
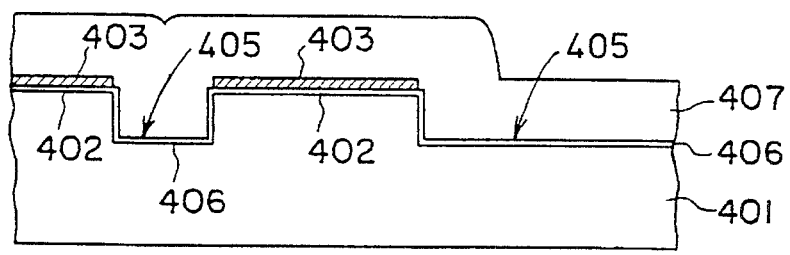

Further, as shown in FIG. 2E, a silicon oxide film 407 is deposited as a burying material in accordance with the CVD technique under reduced pressure. The thickness of the silicon oxide film 407 is about 600 nm which is enough to bury the trenches 405. In this process, the trenches 405 are completely filled with the silicon oxide film 406 and the CVD silicon oxide film 407 (both insulating films). In this process, it is preferable to determine the thickness of the burying film within a range from 80 to 120% of the level difference between the convex and concave portions formed on the surface of the substrate 401.

Figure 2F:
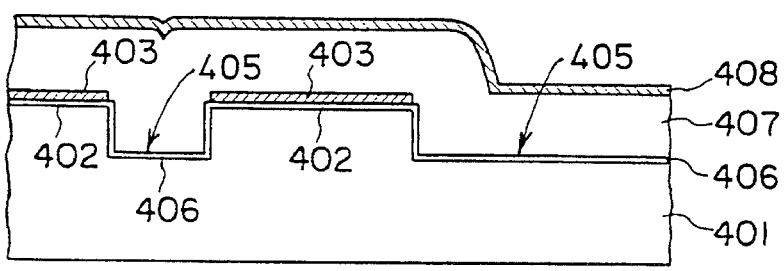

Further, as shown in FIG. 2F, a second silicon nitride film 408 with a thickness of about 150 nm is formed thereon as a second stopper layer in accordance with the CVD technique.

Figure 2G:
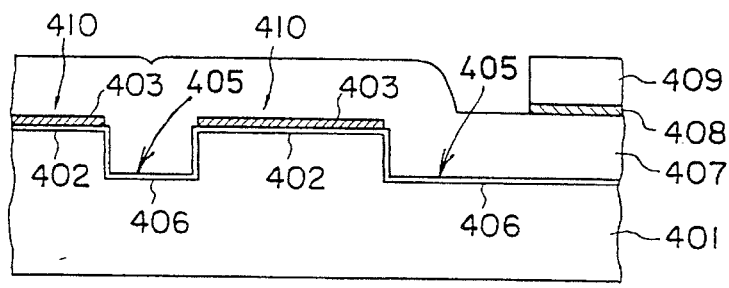

Further, as shown in FIG. 2G, a resist is applied all over the surface thereof to obtain a resist pattern 409 by photo-lithography. With the use of the obtained mask, the silicon nitride film 408 on and near the element regions 410 (the convex portions on the substrate 401) are selectively removed.

Figure 2H:
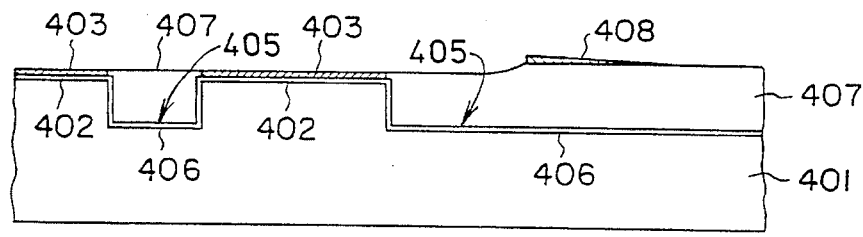

Further, as shown in FIG. 2H, the unnecessary resist pattern 409 is removed. The projecting CVD silicon oxide film 407 is polished uniformly from above until the first silicon nitride film 403 can be exposed. The polishing conditions are determined as follows: the polishing speed of the CVD silicon oxide film 407 is 150 nm/min, and that of the silicon nitride films 403 and 408 is 30 nm/min, and the polishing time is about 5 min which corresponds to a 20% over-polishing quantity required for only the CVD silicon oxide film 407. Accordingly, since the second silicon nitride film 408 exposed at the initial stage of the polishing can be polished at the polishing speed determined for the silicon nitride film 408, in particular at the position remote from the level difference portions, it is possible to polish all the surfaces uniformly. In the vicinity of the level difference portion, however, since the polishing pressure applied onto the second silicon nitride film 408 is reduced due to the influence of the convex portion 410, the polishing speed is reduced, so that all the surfaces are not removed uniformly and thereby the second silicon nitride film 408 remains somewhat as shown.

Figure 2I:
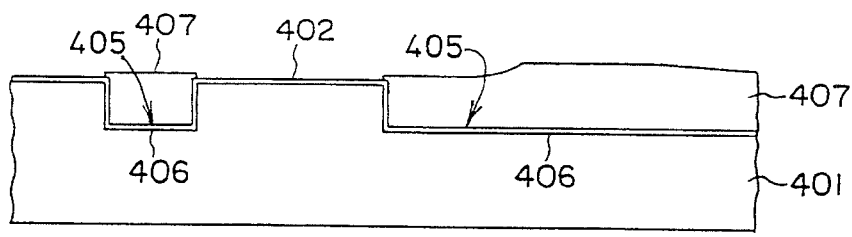

Further, as shown in FIG. 2I, the exposed first silicon nitride film (the first stopper layer) 403 and the remaining second nitride film (the second stopper layer) 408 can be removed. Such removal advantageously improves the gettering effect.

Figure 2J:
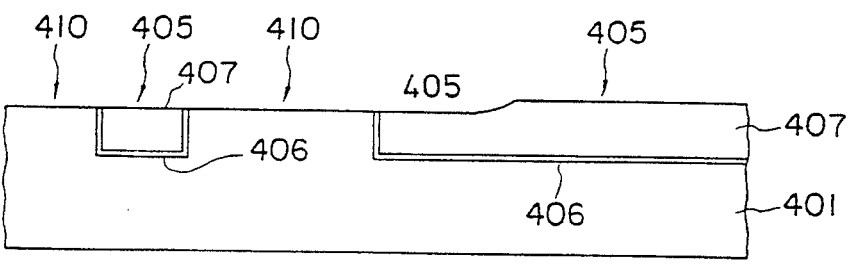

Thereafter, as shown in FIG. 2J, the silicon oxide film 402 on the element regions 410 of the substrate 401 is removed in a hydrofluoric acid (ammonium fluoride) solution for about 15 sec so as to etch the surface by a thickness of about 25 nm and thereby to expose the surface of the semiconductor substrate 401. Thereafter, in accordance with well-known techniques, a MOS gate structure, source and drain diffusion layers, insulating layers intervening between interconnections, electrode interconnection, etc. are formed on the substrate surface at the exposed element regions 410 for formation of an active element.

As described above, in the method of manufacturing the semiconductor device according to the present invention, it is possible to simply bury the burying material flatwise at the element-separating regions. Further, in order to maintain the stable polishing speed for the projecting burying material 407, the surface level of the second stopper film 408 is determined to be small, relative to the surface level difference at the projecting portion of the burying material 407, so that the polishing loss can be reduced. Further, it is also preferable to select the material of extremely low polishing speed as the material of the second stopper layer 408 and to reduce the thickness of the second stopper layer. Here, as an application of this embodiment, it is also possible to obtain a further excellent polished and planarized surface by selecting a material having a high hardness and a low mechanical polishing speed (e.g., carbon film, tungsten (W) film, titanium (Ti) film, a chemical compound of these metals, etc.) as the material of the second stopper layer 408.

Furthermore, since the optimum position at which the second stopper film 408 is to be formed differs according to the relative relationship in polishing speed between the burying material 407 and the second stopper material 408, when the ratio of both is small, it is also possible to extend the second stopper layer 408 to the side wall of the convex portion of the burying material.

A second embodiment of the present invention will be described hereinbelow with reference to FIGS. 3A to 3G, in which the present invention is applied to a method of manufacturing a multilayer interconnection structure, in particular.

Figure 3A:
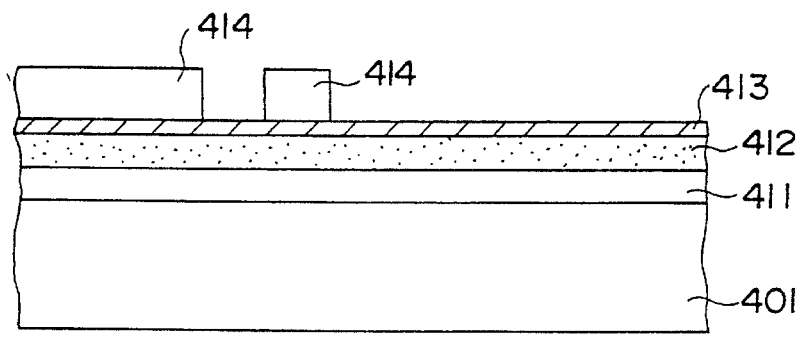
FIGS. 3A to 3G are cross-sectional views for assistance explaining a second embodiment of the method of manufacturing the semiconductor device according to the present invention, which is applied to a multilayer interconnection structure.

First, as shown in FIG. 3A, a P-type (100) silicon semiconductor substrate 401 with a resistivity of 1 to 2 Ωcm is prepared. Further, a first silicon oxide film 411 with a thickness of about 800 nm is formed on the substrate 401 in accordance with a vapor growth (or vapor phase epitaxy) technique; a first aluminum film 412 with a thickness of about 600 nm is formed thereon by a sputtering technique; and further a first silicon nitride film 413 with a thickness of about 50 nm is formed thereon in sequence. Successively, a photoresist 414 is applied all over the surface thereof and patterned by photo-lithography.

Figure 3B:
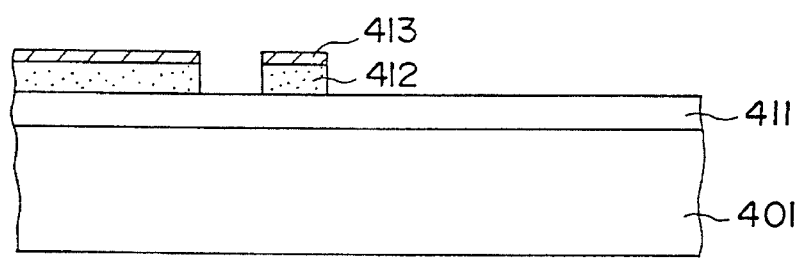

Further, as shown in FIG. 3B, with the use of the patterned resist 414 as a mask, the first silicon nitride film 413 and the first aluminum film 412 are etched by the RIE method for patterning so as to expose the silicon oxide film 411. Thereafter, the resist 414 is removed.

Figure 3C:
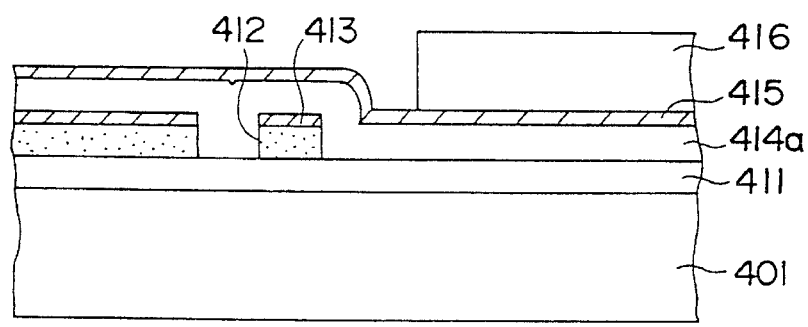

Further, as shown in FIG. 3C, a second silicon oxide film 414a with a thickness of about 600 nm and a second silicon nitride film 415 with a thickness of about 50 nm are deposited in sequence thereon. After this deposition process, the second silicon nitride film 415 is still depressed at a broad concave portion in a relatively large area. Thereafter, a resist is applied thereon and a resist pattern layer 416 is selectively formed on the concave portion by photolithography.

Figure 3D:
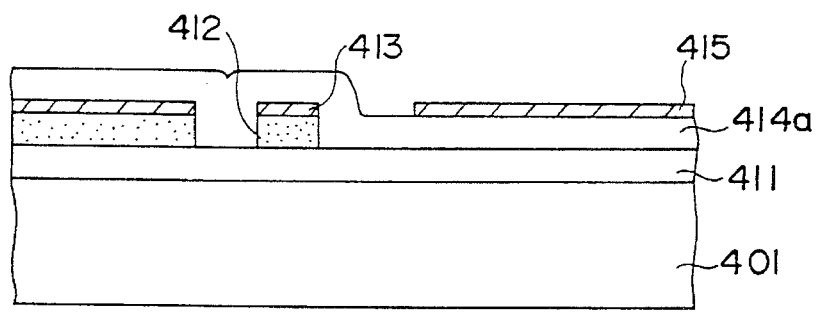

Further, as shown in FIG. 3D, the second silicon nitride film 415 is etched by the RIE method by the use of the resist pattern layer 416 as a mask to form the second silicon nitride film 415 at only the broad concave portion. Thereafter, the resist layer 416 is stripped off.

Figure 3E:
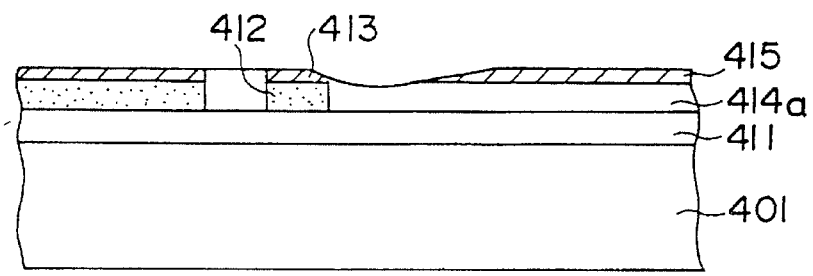

Successively, as shown in FIG. 3E, the second silicon oxide film 414 is polished with the first silicon nitride film 413 and the second silicon nitride film 415 as stopper layers for planarization of all over the surface thereof. The polishing conditions are the same as with the case of the first embodiment as shown in FIG. 2H.

Figure 3F:
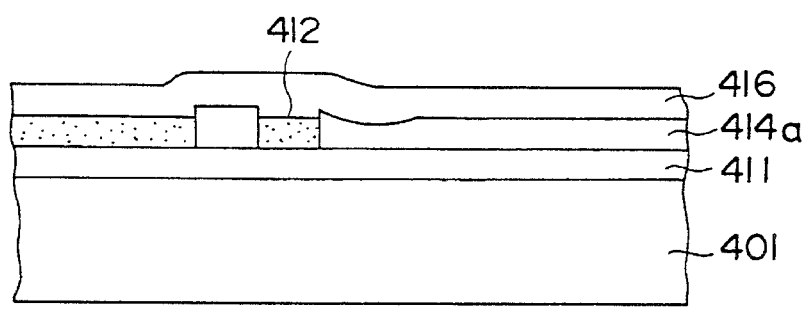

Further, as shown in FIG. 3F, the first silicon nitride film (the first stopper layer) 413 and the second silicon nitride film (the second stopper layer) 415 are both removed by a chemical dry etching method, and further a third silicon oxide film 418 with a thickness of about 800 nm is deposited thereon by the vapor phase epitaxy technique.

Figure 3G:
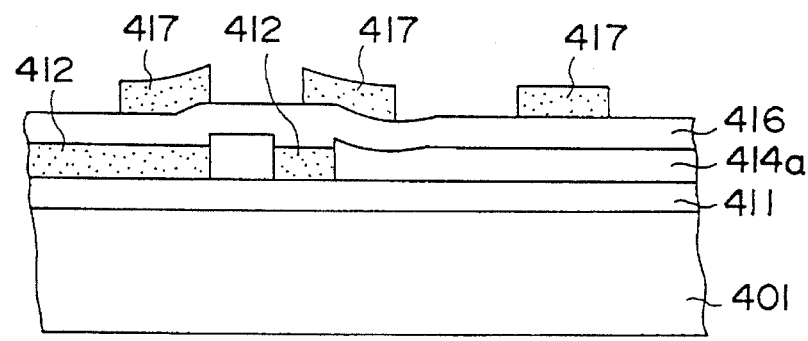

Further, as shown in FIG. 3G, aluminum is deposited all over the surface thereof by sputtering, and patterned by the photo-lithography to form a second aluminum interconnection film 417.

As described above, in the multilayer interconnection structure of the second embodiment, since it is possible to planarize the upper surface of the interlayer insulating film between the multilayer interconnection portions, without being subjected to the influence of the level difference of the first layer interconnection portion (the aluminum film 412), any etching residual or any disconnection (which tends to occur at the level difference portion) can be prevented from occurring at the second layer interconnection portion (the aluminum film 417).

A third embodiment of the present invention (a modification of the second embodiment) will be described hereinbelow with reference to FIGS. 4A to 4B, in which the first silicon nitride film 413 formed in the process shown in FIG. 3A is omitted.

Figure 4A:
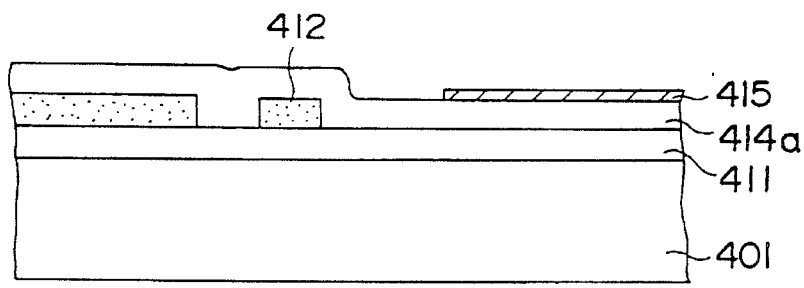
FIGS. 4A to 4B are cross-sectional views for assistance explaining a third embodiment of the method of manufacturing the semiconductor device according to the present invention.

As shown in FIG. 4A (which corresponds to FIG. 3D), the second silicon nitride film 415 is deposited at the broad concave portion. However, no silicon nitride film is formed on the first aluminum film 412.

Figure 4B:
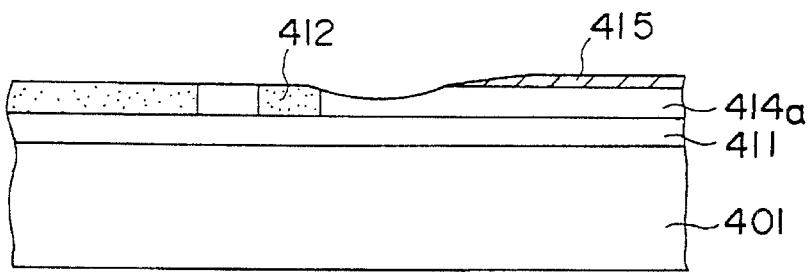

As shown in FIG. 4B, under these conditions, the substrate is polished with the use of the second silicon nitride film 415 as a stopper layer, until the surface of the first aluminum film 412 can be exposed. The surface of the first aluminum film 412 can be detected by monitoring an abrupt change in torque of a polishing motor. In this case, although the aluminum film 412 is necessarily over-etched, there arises no serious problem because this film is used only for interconnection. Further, it is also preferable to determine the thickness of this aluminum film 412 to be relatively large under due consideration of the over-etching.

Thereafter, the second aluminum interconnection film 417 is formed in quite the same process as explained with reference to FIGS. 3E and 3F. In the above-mentioned method, it is also possible to obtain a highly reliable interconnection structure in the same way as with the case of the second embodiment.

A fourth embodiment of the present invention will be described with reference to FIGS. 5A to 5H.

Figure 5A:
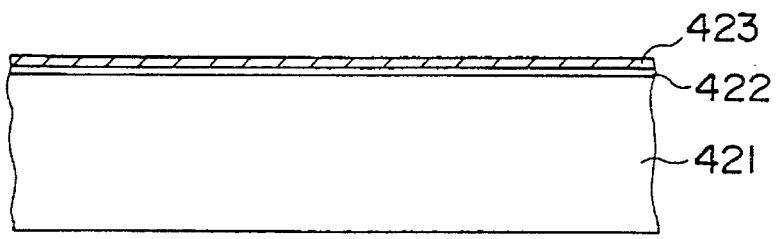
FIGS. 5A to 5H are cross-sectional views for assistance explaining a fourth embodiment of the method of manufacturing the semiconductor device according to the present invention.

First, as shown in FIG. 5A, a P-type (100) silicon semiconductor substrate 421 with a resistivity of 1 to 2 Ωcm is oxidized within an oxidizing atmosphere at about 1000° C. to form a silicon oxide film 422 with a thickness of about 15 nm on the surface thereof as a protective film. Further, a polysilicon film 423 with a thickness of about 100 nm is deposited as a first stopper layer on the silicon oxide film 422 in accordance with the CVD (chemical vapor deposition) technique.

Figure 5B:
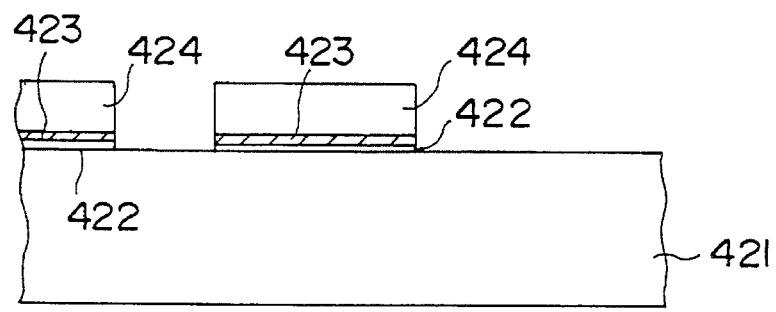

Successively, as shown in FIG. 5B, a photoresist is applied on the silicon nitride film 423 to obtain a resist pattern 424 by photo-lithography. With the use of the obtained mask, the polysilicon film 423 and the silicon oxide film 422 both formed on the regions at which element separating portions are to be formed are selectively removed by the RIE method to expose the surface of the substrate 421.

Figure 5C:
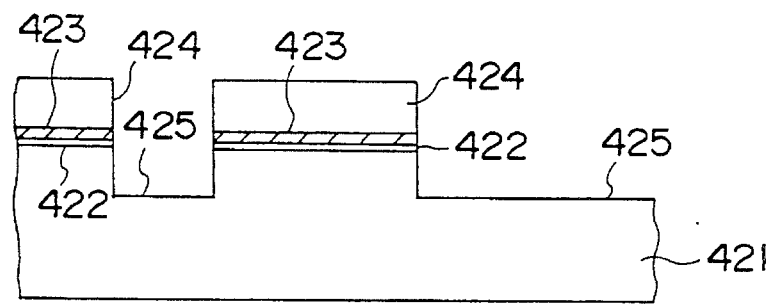

Further, as shown in FIG. 5C, the semiconductor substrate 421 is further etched by the RIE method under other conditions with the use of the resist pattern 424 and the polysilicon film 423 as masks, to form trenches 425 having a depth of about 0.5 micron on the surface of the substrate 421.

Figure 5D:
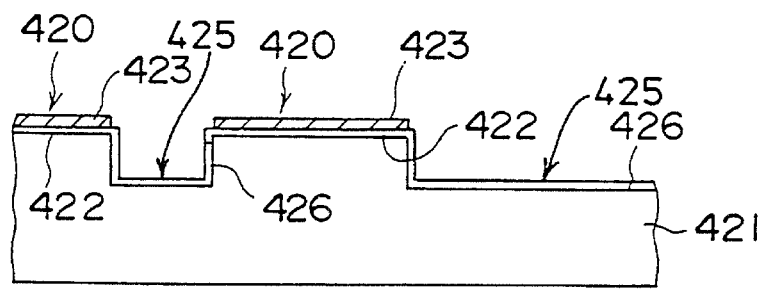

Further, as shown in FIG. 5D, the unnecessary resist pattern 424 is removed and then the exposed surfaces within the trenches 425 of the substrate 421 are cleaned. Thereafter, the substrate surface 421 is oxidized at about 900° C. within an oxidizing atmosphere to form a silicon oxide film 426 with a thickness of about 10 nm as an insulating film. Under these conditions, convex portions 420 and concave portions 425 are formed on the substrate surface 421.

Figure 5E:
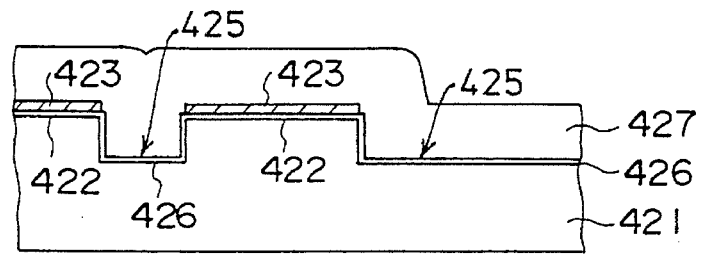

Further, as shown in FIG. 5E, a silicon oxide film 427 is deposited as a burying material in accordance with the CVD technique under reduced pressure. The thickness of the silicon oxide film 427 is about 600 nm, which is enough to bury the trenches 425. In this process, the trenches 425 are completely filled with the silicon oxide film 426 and the CVD silicon oxide film 427 (both insulating films).

Figure 5F:
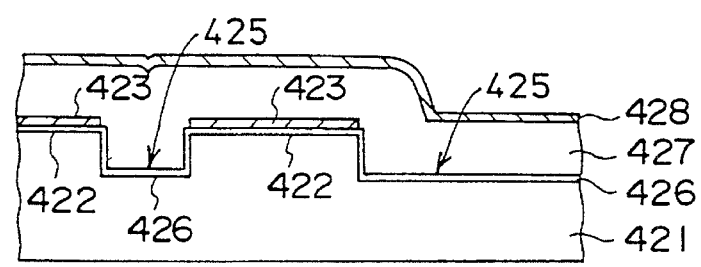

Further, as shown in FIG. 5F, a second polysilicon film 428 with a thickness of about 300 nm is formed thereon as a second stopper layer in accordance with the CVD technique.

Figure 5G:
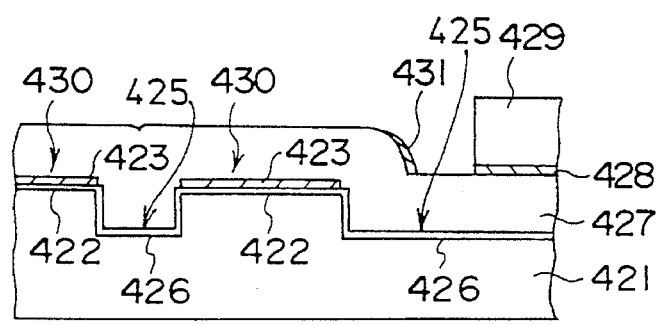

Further, as shown in FIG. 5G, a resist is applied all over the surface thereof to obtain a resist pattern 429 (which remains at the broad concave portion) by photo-lithography. With the use of the obtained mask, the second polysilicon film 428 on and near the element regions 430 (the convex portions on the substrate) are selectively removed by the RIE method. In this process, a side wall 431 is formed on the level difference portion of the CVD silicon oxide film 427.

Figure 5H:
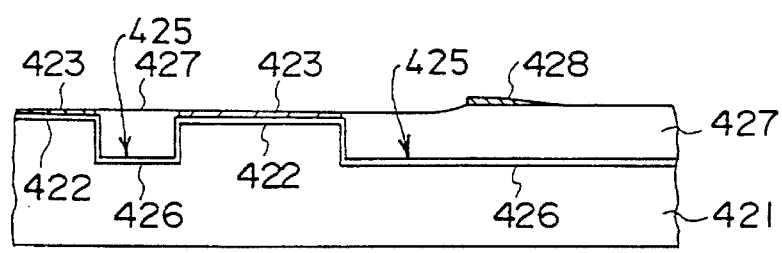

Further, as shown in FIG. 5H, the unnecessary resist pattern 429 is removed. The projecting CVD silicon oxide film 427 is polished by the mechanical polishing uniformly from above Until the first polysilicon film 423 can be exposed. The polishing conditions are determined as follows: the polishing speed of the CVD silicon oxide film 427 is 240 nm/min and;the polishing speed of the polysilicon films 423 and 428 is 30 nm/min, and the polishing time is about 3 min which corresponds to a 20% over-polishing for only the CVD silicon oxide film 427. Further, a part of the polysilicon film 428 remains in the same way as with the case of the first embodiment, whose reason has been already explained with reference to FIG. 2H.

Thereafter, the polysilicon films 423 and the 428 are removed to obtain a planarized surface on the substrate. In accordance with the well-known technique, a MOS gate structure, source and drain diffusion layers, insulating layers intervening between interconnections, electrode interconnection, etc. are formed on the substrate surface at the exposed element regions 430 so that an active element can be formed. In this case, the silicon oxide film 427 serves as an element separating region.

Figure 6A:
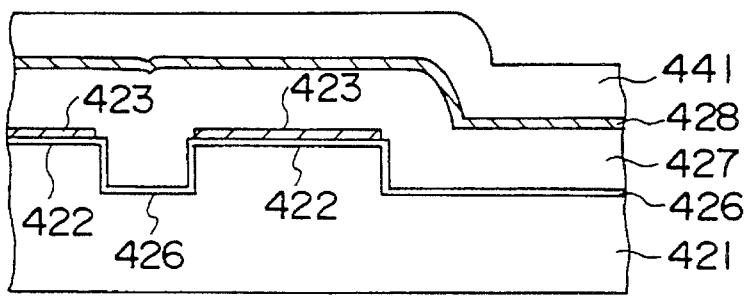
FIGS. 6A to 6B are cross-sectional views for assistance explaining a fifth embodiment of the method of manufacturing the semiconductor device according to the present invention.
Figure 6B:
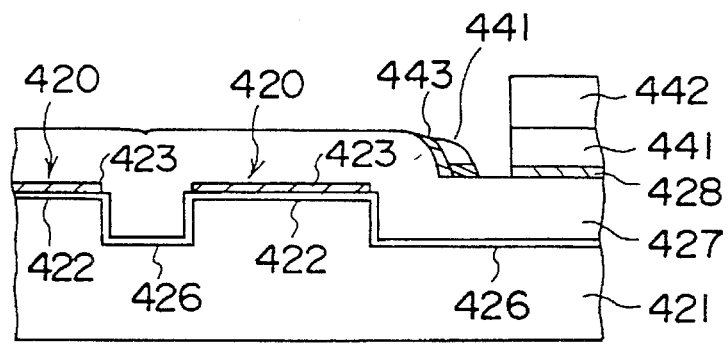
Figure 8A:
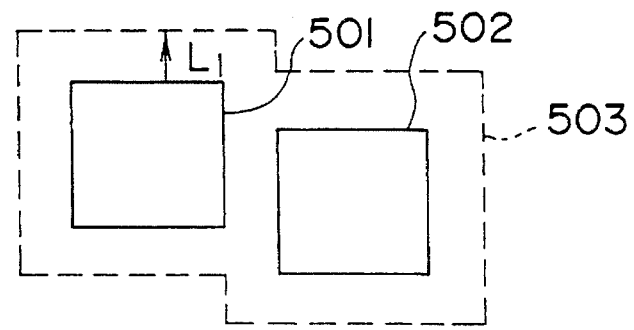
FIGS. 8A and 8B are views for assistance in explaining a method of determining a mask pattern size of a stopper layer formed on two close adjacent concave portions.

Further, instead of the process as explained with reference to FIG. 5F, the following process can be adopted: as shown in FIG. 8A, a third silicon oxide film 441 with a thickness of about 800 nm is additionally deposited on the polysilicon film 428 in accordance with the CVD technique. Further, as shown in FIG. 6B, the substrate is etched back with the use of the patterned resist 442 by the RIE method to leave the polysilicon film 443 and the third silicon oxide film 441 at the level difference portion of the silicon oxide film 427. Thereafter, the resist is removed and then the substrate is polished. Under these conditions, it is possible to obtain the substrate as shown in FIG. 5H.

In this fourth embodiment, since the silicon oxide film can be deposited even at the broad concave portion, it is possible to increase the degree of planarization all over the surface of the semiconductor substrate before polishing, so that the degree of planarization thereof after polishing can be also improved.

Still another modification of the present invention will be described hereinbelow with reference to FIG. 7, in which since two element forming regions are close to each other, the second stopper layer is not formed at the concave portion between both the element forming regions.

Figure 7:
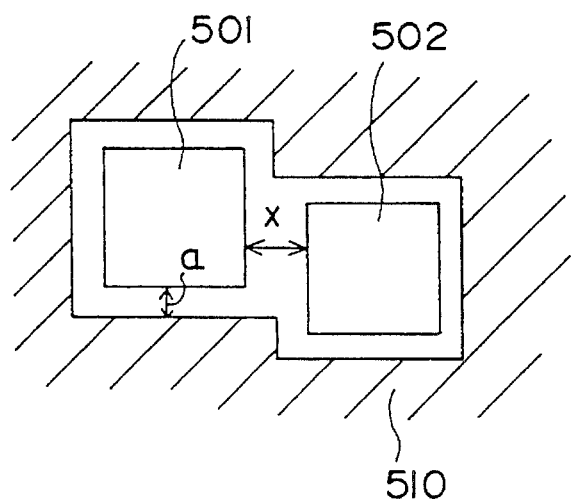
FIG. 7 is a view for assistance in explaining positional relationship between two close adjacent concave portions as to whether the stopper layer is formed or not.

In FIG. 7, x denotes the distance between the two close element-forming regions 501 and 502, and A denotes the distance between the element-forming regions 501 and 502 and the second stopper layer 510 at the broad concave portions. In this case, when the thickness of the silicon oxide film deposited on the element-forming region is denoted by W and the resolution limit (linewidth limit formable with practical lithography technology) is denoted by y, the second stopper layer 510 is not deposited for simplification of the mask formation, to the extent that the following two conditions can be satisfied:

(1) a>w (2) x<2a+y

Figure 8B:
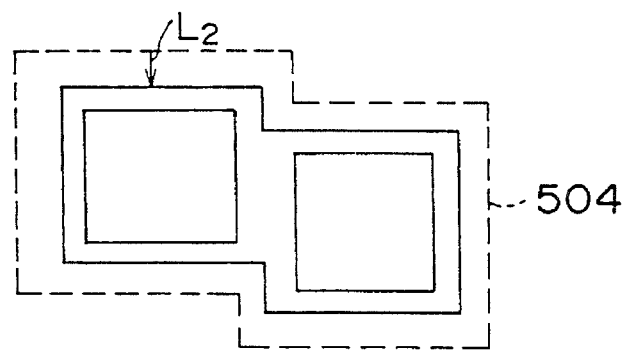

The above-mentioned mask can be formed by the procedure as shown in FIGS. 8A and 8B. First, as shown in FIG. 8A, a shape obtained by expanding the two element-forming regions 501 and 502 by a distance L1 in both vertical and horizontal directions is determined. Here, the distance L1 is determined so as to satisfy the following condition:

L1>(2a+y)/2

Therefore, when the distance x is small, the two expanded element-forming regions can be combined with each other as a single pattern 503.

Further, as shown in FIG. 8B, the perimeter of the pattern 503 is contracted by the distance L2 to obtain a new pattern 504. Here, the distance L2 is determined so as to satisfy the following condition:

L2<L1−a

Figure 9:
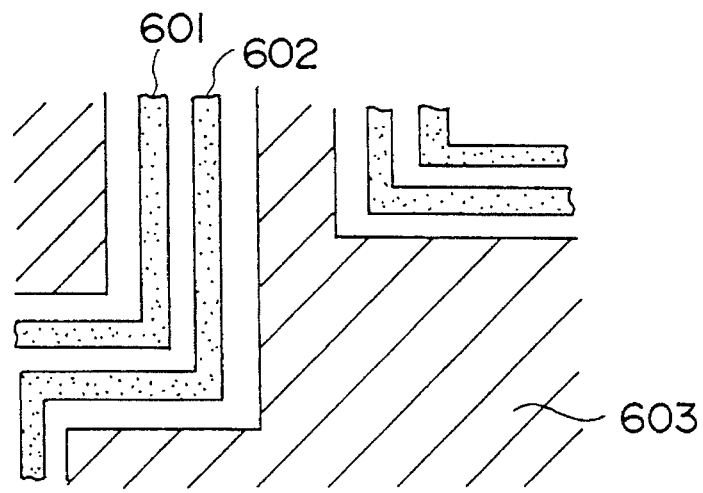
FIG. 9 is a view for assistance in explaining the relationship between the two close adjacent metallic interconnections as to whether the stopper layer is formed or not.

Further, as shown in FIG. 9, the above-mentioned method of forming the second stopper layer can be also applied when the interconnection layers are formed in the same way as above. In FIG. 9, when two interconnection layers 601 and 602 are close to each other, the stopper layer 603 is not formed between the two close interconnection layers.

What is claimed is:

1. A method of manufacturing a semiconductor device, the method comprising the steps of:

forming a first stopper layer on a surface of a convex portion of a semiconductor substrate having convex and concave portions on a surface thereof;

forming a burying film all over the surface of the semiconductor substrate to bury the concave portion;

forming a second stopper layer selectively on a surface of the burying film at the concave portion; and removing the burying film flatwise by polishing until a surface of the first stopper layer is exposed, wherein a thickness of the second stopper layer is smaller than a level difference between the convex and concave portions on the surface of the semiconductor substrate.

2. The method of manufacturing a semiconductor device of claim 1, wherein the first and second stopper layers are any one of silicon nitride film and polysilicon film.

3. The method of manufacturing a semiconductor device of claim 1, wherein the first and second stopper layers are formed of an abrasion-resistant substance selected from the group consisting of carbon, tungsten, titanium and a compound of one of these elements and another substance.

4. The method of manufacturing a semiconductor device of claim 1, wherein only when a distance between two adjacent convex portions is larger than an addition of a double thickness of the burying film and a minimum film-formable dimension, the second stopper layer is formed on the burying film buried at the concave portion between two convex portions.

5. The method of manufacturing a semiconductor device of claim 1, wherein a thickness of the burying film is selected in a range from 80 to 120% of a level difference of the convex and concave portions on the semiconductor substrate.

6. The method of manufacturing a semiconductor device of claim 1, wherein the convex portion is an initial surface of the semiconductor substrate, and the concave portion is a trench formed on the semiconductor substrate.

7. The method of manufacturing a semiconductor device, the method comprising the steps of:

forming a first stopper layer on a surface of a convex portion of a semiconductor substrate having convex and concave portions on a surface thereof;

forming a burying film all over the surface of the semiconductor substrate to bury the concave portion;

forming a second stopper layer selectively on a surface of the burying film at the concave portion;

removing the burying film flatwise by polishing until a surface of the first stopper layer is exposed, wherein the convex portion is a first metallic interconnection layer laminated on the semiconductor substrate via a silicon oxide film.

8. The method of manufacturing a semiconductor device of claim 7, which further comprises the steps of:

after the first and second stopper layers have been removed, depositing a silicon oxide film thereon as an interlayer insulating film; and forming a second metallic interconnection layer on the deposited silicon oxide film.

9. A method of manufacturing a semiconductor device, the method comprising the steps of:

forming a burying film on a surface of a semiconductor substrate having convex and concave portions on a surface thereof to bury the concave portion;

forming a first stopper layer selectively on a surface of the burying film at the concave portion;

removing the burying film flatwise by polishing until a surface of the convex portion is exposed; and forming a second stopper layer on the burying film buried at the concave portion between two convex portions when a distance between two adjacent convex portions is larger than an addition of a double thickness of the burying film and a minimum film-formable thickness.

10. A method of manufacturing a semiconductor device, the method comprising the steps of forming a first polysilicon layer as a first stopper layer on a surface of a convex portion of a semiconductor substrate having convex and concave portions on a surface thereof;

forming a burying film all over the surface of the semiconductor substrate to bury the concave portion;

forming a second polysilicon layer as a second stopper layer selectively on a surface of thelicon layer burying film at the concave portion in accordance with anisotropic etching forming a side wall on a level difference portion of said burying film; and removing the burying film flatwise by polishing until a surface of the first stopper layer is exposed.

11. The method of manufacturing a semiconductor device of claim 10, wherein the step of forming the second polysilicon layer selectively further includes the steps of:

depositing a silicon oxide film, with a thickness more than a level difference existing on the second polysilicon layer, on the deposited second polysilicon layer; and patterning the deposited silicon oxide film together with the second polysilicon layer.

12. The method of manufacturing a semiconductor device of claim 10, wherein only when a distance between two adjacent convex portions is larger than an addition of a double thickness of the burying film and a resolution limit, the second stopper layer is formed on the burying film buried at the concave portion between two convex portions.

13. A method of manufacturing a semiconductor device, the method comprising the steps of:

forming a first silicon oxide film and a first stopper layer on a semiconductor substrate;

patterning said first silicon oxide film and the first stopper layer using a photoresist film;

etching said semiconductor substrate using remaining portions of said first silicon oxide film and said first stopper layer as an etching mask to form a concave portion;

forming a second silicon oxide film on side and bottom surfaces of the concave portion;

forming a burying film all over a surface of the semiconductor substrate to bury the concave portion;

forming a second stopper layer selectively on a surface of the burying film at the concave portion;

removing the burying film flatwise by polishing until a surface of the first stopper layer is exposed; and removing the first and second stopper layers.

14. The method of manufacturing a semiconductor device of claim 13, wherein said first and second stopper are silicon nitride films.

15. The method of manufacturing a semiconductor device of claim 13, wherein said first and second stopper are polysilicon films.

16. The method of manufacturing a semiconductor device of claim 13, wherein the first and second stopper layers are formed of an abrasion-resistant substance selected from the group consisting of carbon, tungsten, titanium and a compound of one of these elements and another substance.

17. The method of manufacturing a semiconductor device of claim 13, wherein a thickness of the burying film is selected in a range from 80 to 120% of a level difference of the convex and concave portions on the semiconductor substrate.

18. The method of manufacturing a semiconductor device of claim 13, the method further including the step of:

after the first and second stopper layers have been removed, removing the first silicon oxide film to expose the surface of the substrate.

19. A method of manufacturing a semiconductor device, the method comprising the steps of:

forming a first silicon oxide film, a first metallic interconnection layer and a first stopper layer on a semiconductor substrate;

patterning said first stopper layer and said first metallic interconnection layer using a photoresist film, wherein a remaining portion of said first stopper layer and said first metallic interconnection layer is a convex portion, and a removed portion is a concave portion;

forming a burying film all over a surface of the semiconductor substrate to bury the concave portion;

forming a second stopper layer selectively on a surface of the burying film at the concave portion;

removing the burying film flatwise by polishing until a surface of the first stopper layer is exposed; and removing the first and second stopper layers.

20. The method of claim 19, wherein said first metallic interconnection layer is an aluminum layer.

21. The method of claim 19, wherein said method further includes the steps of:

after the first and second stopper layers have been removed, depositing a silicon oxide film thereon as an interlayer insulating film; and forming a second metallic interconnection layer on the deposited silicon oxide film.

22. The method of claim 21, wherein said second metallic interconnection layer is an aluminum layer.

23. A method of manufacturing a semiconductor device, the method comprising the steps of:

forming a first silicon oxide film and a first metallic interconnection layer on a semiconductor substrate;

patterning said first metallic interconnection layer using a photoresist film, wherein a remaining portion of said first metallic interconnection layer is a convex portion, and a removed portion is a concave portion;

forming a burying film all over a surface of the semiconductor substrate to bury the concave portion;

forming a stopper layer selectively on a surface of the burying film at the concave portion; and removing the burying film flatwise by polishing until a surface of the first metallic interconnection layer is exposed.

24. The method of claim 23, wherein said first metallic interconnection layer is an aluminum layer.

25. A method for manufacturing a semiconductor device, the method comprising:

forming convex and concave portions on a surface of a semiconductor substrate;

forming a burying film on the surface of the semiconductor substrate having convex and concave portions on the surface thereof to bury the concave portions;

forming a first stopper layer on a surface of the burying film in a stopper pattern;

removing the burying film flatwise by polishing until a surface of the convex portion is exposed; and removing the first stopper layer, wherein the stopper pattern is obtained by using the following steps:

expanding patterns of the convex portions by a distance L1 to form expanded patterns;

merging the expanded patterns to form a merged pattern; and shrinking the merged pattern by a distance L2 which is smaller than the distance L1 to form the stopper pattern.

26. The method for manufacturing a semiconductor device according to claim 25, wherein the following formula is satisfied:

L2<L1-a, where "a" is a minimum value of distances between the patterns of the convex portions.

27. The method for manufacturing a semiconductor device according to claim 25, wherein the following formula is satisfied:

L1<(2a+y)/2, where "a" is a minimum value of distances between the patterns of the convex portions, and "y" is a resolution limit.

28. A method for manufacturing a semiconductor device, the method comprising:

forming convex and concave portions on a surface of a semiconductor substrate;

forming a first stopper layer on the semiconductor substrate on the convex portions;

forming a burying film on the surface of the semiconductor substrate having convex and concave portions on the surface thereof to bury the concave portions;

forming a second stopper layer on a surface of the burying film in a stopper pattern;

removing the burying film flatwise by polishing until the first stopper is exposed; and removing the first stopper layer, wherein the stopper pattern is obtained by using the following steps:

expanding patterns of the convex portions by a distance L1 to form expanded patterns;

merging the expanded patterns to form a merged pattern; and shrinking the merged pattern by a distance L2 which is smaller than the distance L1 to form the stopper pattern.

29. The method for manufacturing a semiconductor device according to claim 18, wherein the following formula is satisfied:

L2<L1-a, where "a" is a minimum value of distances between the patterns of the convex portions.

30. The method for manufacturing semiconductor device according to claim 30, wherein the following formula is satisfied:

L1<(2a+y)/2, where "a" is a minimum value of distances between the patterns of the convex portions, and "y" is a resolution limit.

* * * * *